United States Patent
Wu et al.

(10) Patent No.: US 9,754,955 B2
(45) Date of Patent: Sep. 5, 2017

(54) HIGH-K-LAST MANUFACTURING PROCESS FOR EMBEDDED MEMORY WITH METAL-OXIDE-NITRIDE-OXIDE-SILICON (MONOS) MEMORY CELLS

(71) Applicant: Taiwan Semiconductor Manufacturing Co., Ltd., Hsin-Chu (TW)

(72) Inventors: Wei Cheng Wu, Zhubei (TW); I-Ching Chen, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 14/983,682

(22) Filed: Dec. 30, 2015

(65) Prior Publication Data

US 2017/0194333 A1   Jul. 6, 2017

(51) Int. Cl.
H01L 21/28        (2006.01)
H01L 21/31        (2006.01)
(Continued)

(52) U.S. Cl.
CPC .... H01L 27/1157 (2013.01); H01L 21/28282 (2013.01); H01L 21/32115 (2013.01);
(Continued)

(58) Field of Classification Search
CPC .......... H01L 27/115; H01L 29/792; H01L 27/11568; H01L 27/11521; H01L 27/105;
H01L 21/28282; H01L 21/32115; H01L 21/32133; H01L 27/11573; H01L 29/495; H01L 29/4966; H01L 29/513;
(Continued)

(56) References Cited

U.S. PATENT DOCUMENTS 7,611,941 B1 * 11/2009 Shum ................ H01L 21/28273
                                                257/E21.179
8,883,624 B1 * 11/2014 Ramkumar ....... H01L 21/28282
                                                257/E21.423

(Continued)

OTHER PUBLICATIONS

U.S. Appl. No. 14/984,034, filed Dec. 30, 2015.
(Continued)

*Primary Examiner* — John C Ingham
*Assistant Examiner* — Long H Le
(74) *Attorney, Agent, or Firm* — Eschweiler & Potashnik, LLC

(57) ABSTRACT

An integrated circuit (IC) using high-κ metal gate (HKMG) technology with an embedded metal-oxide-nitride-oxide-silicon (MONOS) memory cell is provided. A logic device is arranged on a semiconductor substrate and comprises a logic gate. A memory cell is arranged on the semiconductor substrate and comprises a control transistor and a select transistor laterally adjacent to one another. The control and select transistors respectively comprise a control gate and a select gate, and the control transistor further comprises a charge trapping layer underlying the control gate. The logic gate and one or both of the control and select gates are metal and arranged within respective high κ dielectric layers. A high-κ-last method for manufacturing the IC is also provided.

19 Claims, 13 Drawing Sheets

(51) Int. Cl.
  *H01L 27/1157* (2017.01)
  *H03K 19/08* (2006.01)
  *H01L 27/11573* (2017.01)
  *H01L 29/49* (2006.01)
  *H01L 29/66* (2006.01)
  *H01L 21/3213* (2006.01)
  *H01L 21/321* (2006.01)
  *H01L 29/51* (2006.01)

(52) U.S. Cl.
  CPC .. *H01L 21/32133* (2013.01); *H01L 27/11573* (2013.01); *H01L 29/495* (2013.01); *H01L 29/4916* (2013.01); *H01L 29/4966* (2013.01); *H01L 29/513* (2013.01); *H01L 29/517* (2013.01); *H01L 29/518* (2013.01); *H01L 29/66545* (2013.01); *H03K 19/08* (2013.01)

(58) Field of Classification Search
  CPC ................. H01L 29/517; H01L 29/518; H01L 29/66545; H03K 19/08
  See application file for complete search history.

(56) References Cited

U.S. PATENT DOCUMENTS

| | | | |
|---|---|---|---|
| 2006/0261398 A1* | 11/2006 | Lee | H01L 21/28282 257/314 |
| 2008/0173944 A1 | 7/2008 | Coronel | |
| 2013/0264652 A1 | 10/2013 | Zhu | |
| 2014/0024183 A1* | 1/2014 | Hsu | H01L 27/0629 438/241 |
| 2014/0073126 A1 | 3/2014 | Shen et al. | |
| 2014/0374814 A1* | 12/2014 | Wu | H01L 27/11568 257/326 |
| 2015/0054049 A1 | 2/2015 | Perera | |
| 2015/0093864 A1 | 4/2015 | Perera | |
| 2015/0108475 A1 | 4/2015 | Ando et al. | |
| 2015/0236034 A1* | 8/2015 | Toh | H01L 27/11568 257/324 |
| 2015/0249145 A1 | 9/2015 | Yoshimori | |
| 2015/0279854 A1* | 10/2015 | Hall | H01L 29/66545 438/591 |
| 2015/0311221 A1* | 10/2015 | Huang | H01L 29/49 257/314 |
| 2016/0013313 A1 | 1/2016 | Cheng et al. | |
| 2016/0126327 A1* | 5/2016 | Chen | H01L 29/4916 257/326 |

OTHER PUBLICATIONS

U.S. Appl. No. 14/984,095, filed Dec. 30, 2015.
U.S. Appl. No. 14/983,686, filed Dec. 30, 2015.
Non Final Office Action Dated Oct. 6, 2016 U.S. Appl. No. 14/984,095.
Non Final Office Action Dated Jan. 27, 2017 U.S. Appl. No. 14/984,095.
Non Final Office Action Dated Nov. 3, 2016 U.S. Appl. No. 14/983,686.
Final Office Action dated Apr. 2, 2017 in connection with U.S. Appl. No. 14/983,686.
Final Office Action dated Apr. 27, 2017 in regards to U.S. Appl. No. 14/984,096.
Notice of Allowance dated Jun. 5, 2017 in regards to U.S. Appl. No. 14/984,034.

* cited by examiner

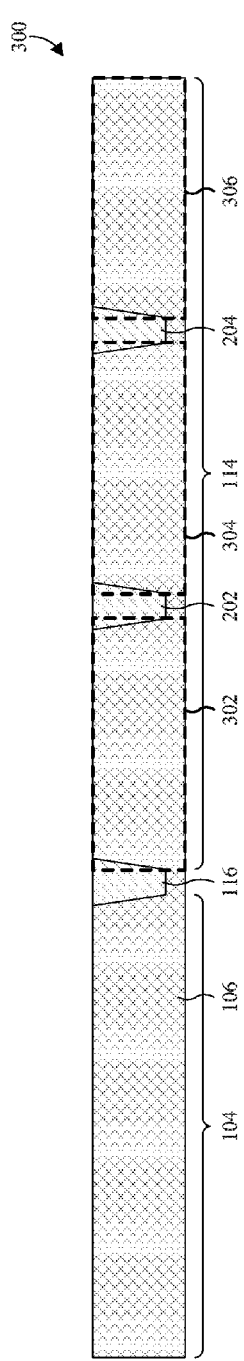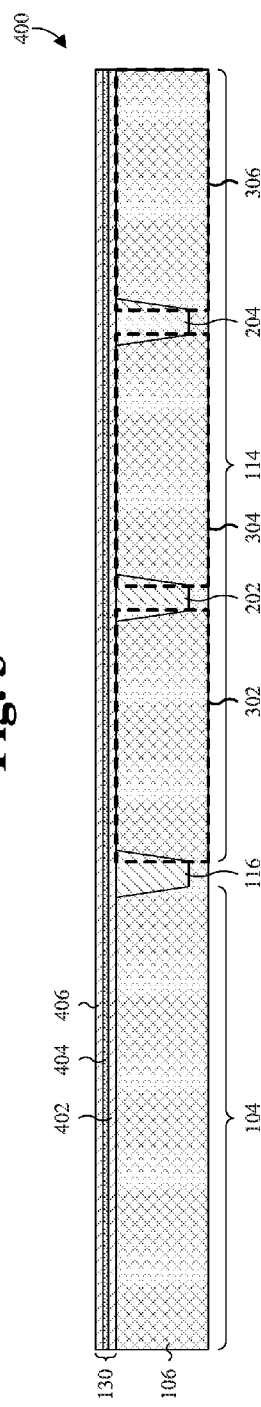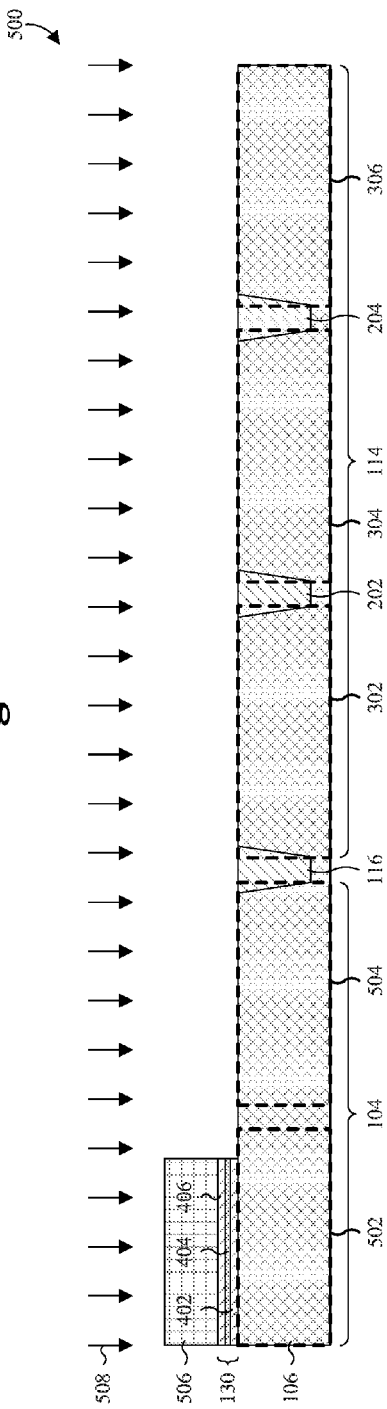

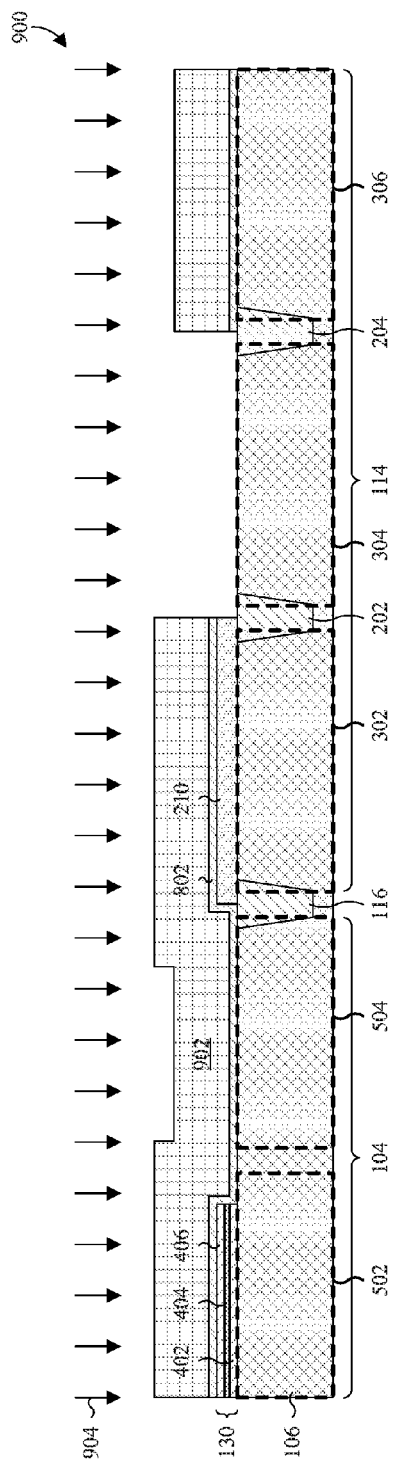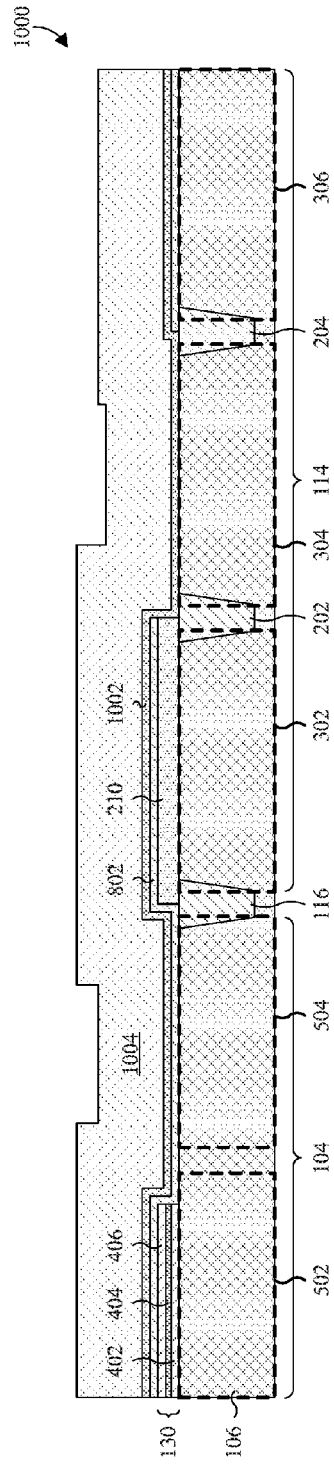

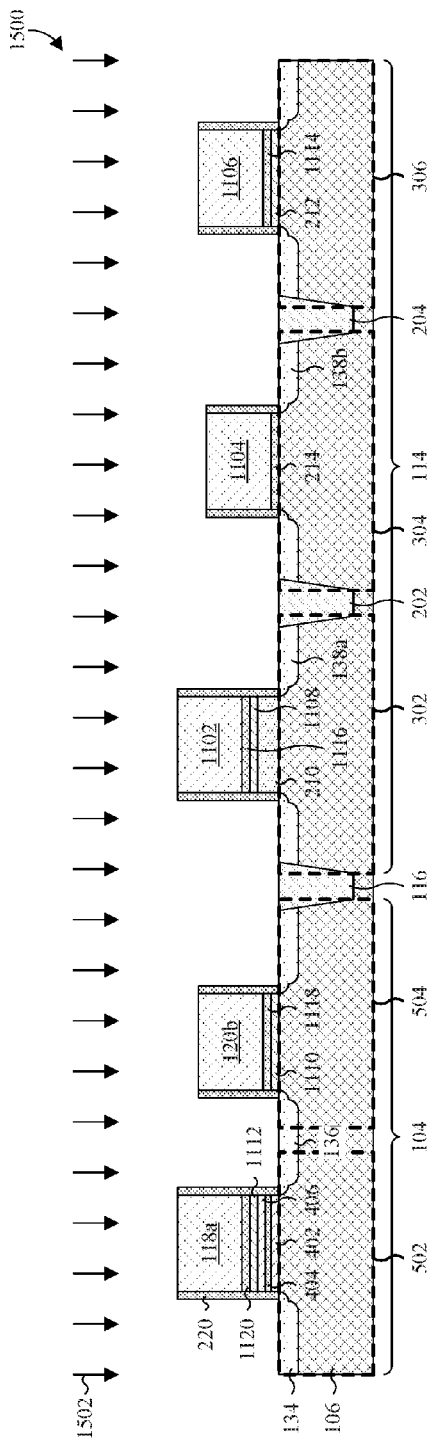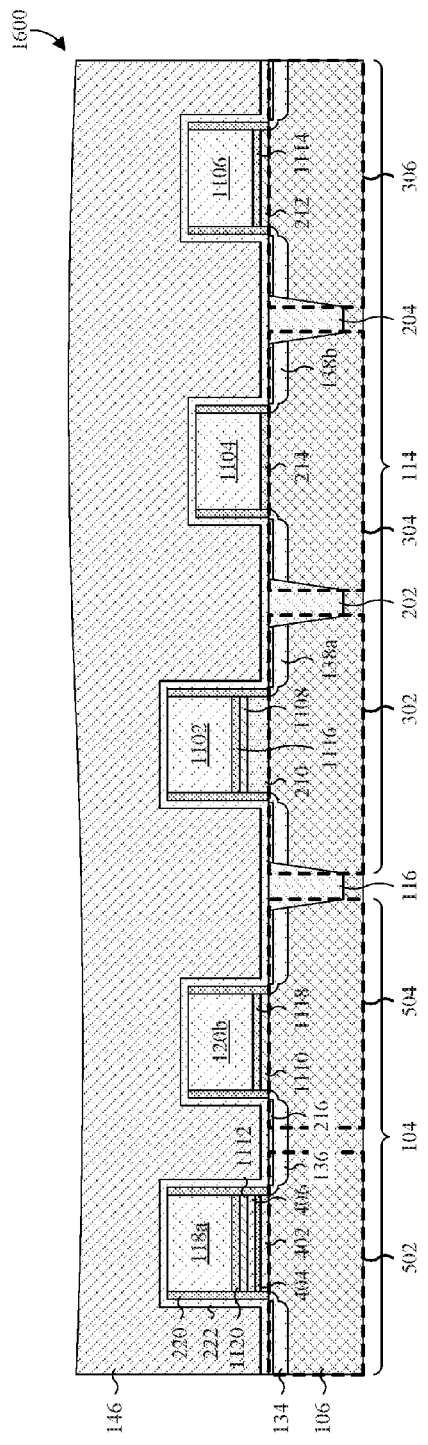

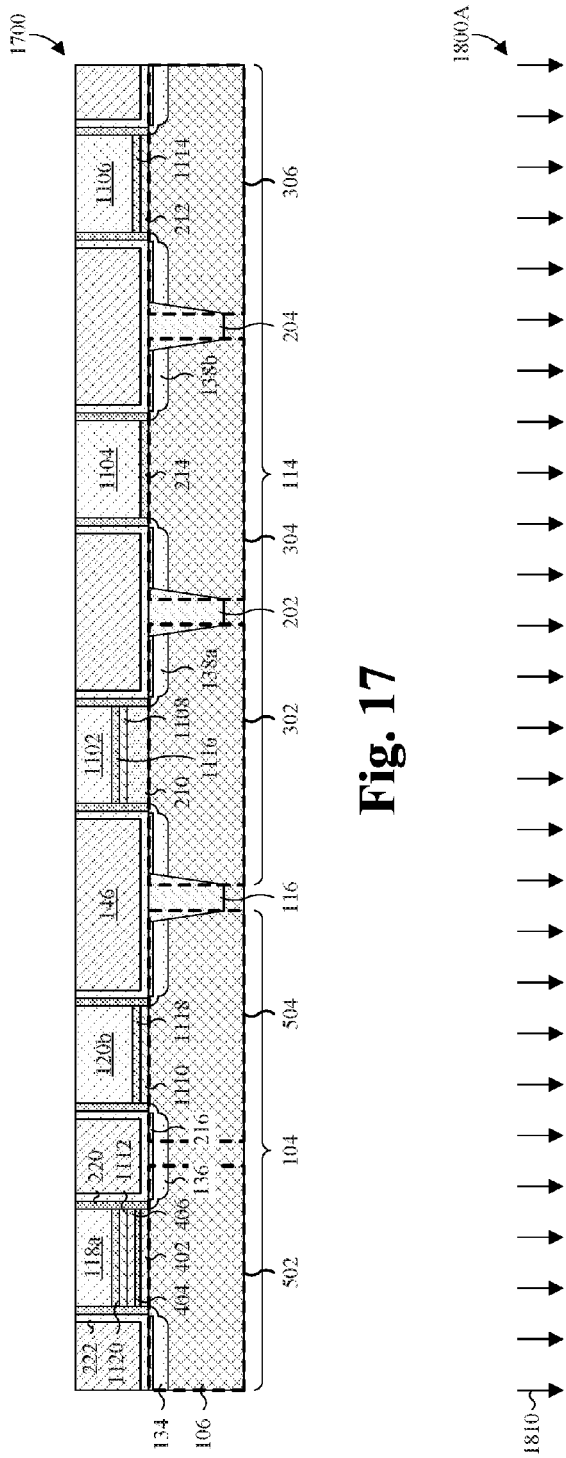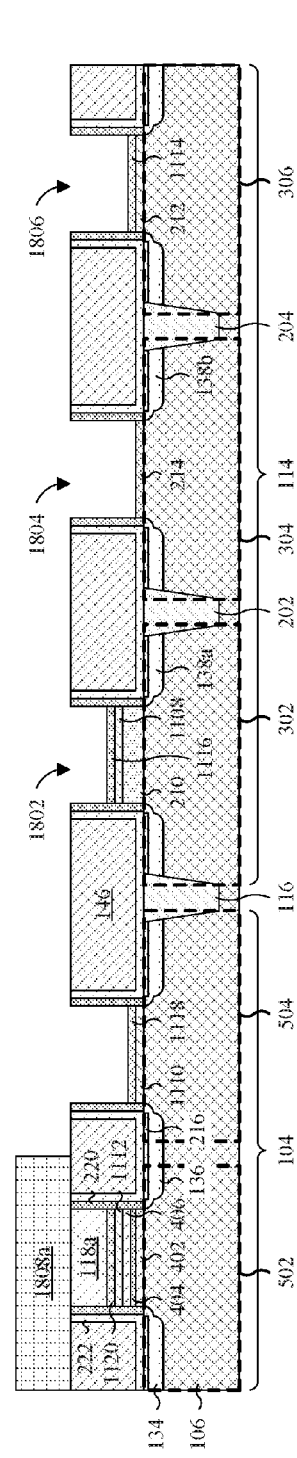
Fig. 17
Fig. 18A

HIGH-K-LAST MANUFACTURING PROCESS FOR EMBEDDED MEMORY WITH METAL-OXIDE-NITRIDE-OXIDE-SILICON (MONOS) MEMORY CELLS

BACKGROUND

Embedded memory is electronic memory that is integrated with logic devices on a common integrated circuit (IC) die or chip. The embedded memory supports operation of the logic devices and is often used with very-large-scale integration (VLSI) IC dies or chips. The integration advantageously improves performance by eliminating interconnect structures between chips and advantageously reduces manufacturing costs by sharing process steps between the embedded memory and the logic devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 3-17, 18A, 18B, 18C, and 19-22 illustrate a series of cross-sectional views of some embodiments of a high-κ-last method for manufacturing an IC with an embedded MONOS memory cell.

DETAILED DESCRIPTION

Figure 1:
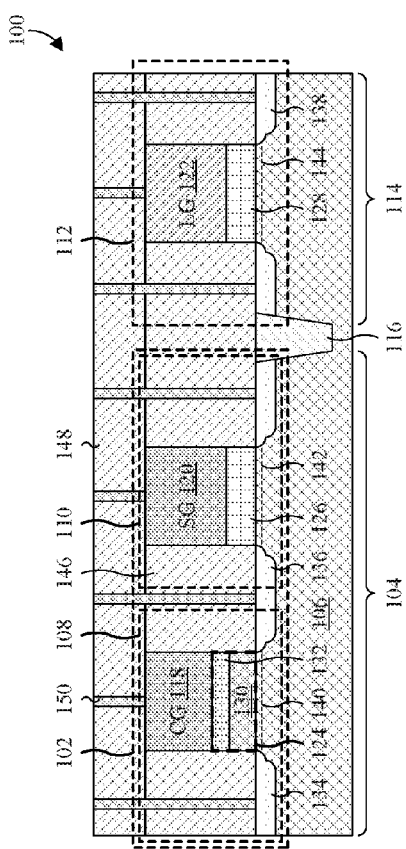
FIG. 1 illustrates a cross-sectional view of some embodiments of an integrated circuit (IC) using high-κ metal gate (HKMG) technology with an embedded metal-oxide-nitride-oxide-silicon (MONOS) memory cell.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some integrated circuits (ICs) comprise logic devices and embedded memory. The logic devices comprise respective polysilicon logic gates arranged over and vertically spaced from a semiconductor substrate by respective logic dielectric regions. The embedded memory comprises an array of two transistor (2T) silicon-oxide-nitride-oxide-silicon (SONOS) memory cells. A 2T SONOS memory cell comprises a polysilicon control gate and a polysilicon select gate laterally spaced over the semiconductor substrate. The polysilicon control and select gates are arranged over and vertically spaced from the semiconductor substrate by respective control and select dielectric regions, and the control dielectric region comprises a charge trapping layer. Further, respective source/drain regions of the polysilicon control and select gates are laterally spaced on opposing sides of the polysilicon control and select gates with a source/drain region arranged laterally between the polysilicon control and select gates.

One challenge with the foregoing ICs is that the ICs are reaching performance and/or scaling limits due to the use of polysilicon gates. Another challenge with the foregoing ICs is that annealing performed on the polysilicon gates may negatively affect the performance of the logic devices. In both cases, performance may be quantified in terms of, for example, power consumption and/or switching speed.

The present application is directed towards an IC using high-K metal gate (HKMG) technology with an embedded metal-oxide-nitride-oxide-silicon (MONOS) memory cell. In some embodiments, the IC comprises a logic device and an embedded memory cell arranged on a semiconductor substrate. The logic device comprises a logic gate, and the embedded memory cell comprises a control transistor and a select transistor. The control and select transistors respectively comprise a control gate and a select gate laterally adjacent to the one another. The logic gate and one or both of the control and select gates are metal and vertically spaced from the semiconductor substrate by respective dielectric layers with dielectric constants κ greater than about 3.9 (i.e., high κ layers). Further, the control gate is vertically spaced from the semiconductor substrate by a charge trapping layer. By incorporating HKMG technology into the embedded memory cell and the logic device, the IC achieves good performance, low power consumption, and scaling. The metal gates and the high κ layers lower leakage currents, increase maximum drain currents, mitigate fermi-level pinning, and lower threshold voltages for the embedded memory cell and the logic device.

The present application is also directed towards a method for manufacturing the IC. In some embodiments, a control gate, a select gate, and a logic gate are formed of polysilicon and laterally spaced over a semiconductor substrate. The logic gate and one or both of the control and select gates are subsequently removed to form gate openings, and high κ layers are formed in the gate openings. Further, new gates of metal are formed in the gate openings. By forming the high κ layers and the metal gates last, manufacturing costs are low and process length is short. Further, in embodiments where both the select and control gates are replaced with metal, thermal processing, such as annealing, associated with polysilicon gates may be omitted. This minimizes thermal processes that affect the performance of logic devices, thereby allowing the IC to achieve good performance.

With reference to FIG. 1, a cross-sectional view 100 of some embodiments of an IC using HKMG technology with an embedded MONOS memory cell 102 is provided. As illustrated, the memory cell 102 is arranged on a memory region 104 of a semiconductor substrate 106, and comprises a control transistor 108 and a select transistor 110. Further, a logic device 112 is arranged on a logic region 114 of the semiconductor substrate 106. The memory region 104 and the logic region 114 are laterally adjacent to one another and, in some embodiments, spaced from one another by an isolation region 116.

Respective gates 118, 120, 122 of the memory cell 102 and the logic device 112 are arranged over and vertically spaced from the semiconductor substrate 106 by respective dielectric regions 124, 126, 128. In some embodiments, upper or top surfaces of the gates 118, 120, 122 are substantially coplanar. The gates 118, 120, 122 comprise a control gate (CG) 118 and a select gate (SG) 120 arranged laterally adjacent to one another and corresponding to the control and select transistors 108, 110. Further, the gates 118, 120, 122 comprise a logic gate (LG) 122 corresponding to the logic device 112. The logic gate 122 and one or both of the control and select gates 118, 120 are metal. In some embodiments, the control gate 118 is polysilicon and the select and logic gates 120, 122 are metal. In other embodiments, the control and logic gates 118, 122 are metal and the select gate 120 is polysilicon. In yet other embodiments, the control, select, and logic gates 118, 120, 122 are metal.

The dielectric regions 124, 126, 128 comprise a control dielectric region 124, a select dielectric region 126, and a logic dielectric region 128 corresponding to the control, select, and logic gates 118, 120, 122. The control dielectric region 124 comprises a charge trapping layer 130 and, in some embodiments, an overlying dielectric subregion 132. Further, ones of the logic, control, and select dielectric regions 124, 126, 128 corresponding to gates that are metal comprise or otherwise are high κ layers. For example, in embodiments where the control gate 118 is polysilicon and the select and logic gates 120, 122 are metal, the control dielectric region 124 may be devoid of a high κ layer, and the select and logic dielectric regions 126, 128 may be or otherwise comprise respective high κ layers.

Advantageously, by incorporating HKMG technology into the memory cell 102 and the logic device 112, the IC achieves good performance, low power consumption, and small scale. The metal gates and the high κ layers lower leakage currents, increase maximum drain currents, mitigate fermi-level pinning, and lower threshold voltages for the memory cell 102 and the logic device 112.

Respective source/drain regions 134, 136, 138 of the gates 118, 120, 122 are arranged in an upper surface of the semiconductor substrate 106. The source/drain regions 134, 136, 138 are arranged on opposite sides of the gates 118, 120, 122 and define respective channel regions 140, 142, 144 of the gates 118, 120, 122 under the gates 118, 120, 122. In some embodiments, the control and select gates 118, 120 share a source/drain region 136 arranged laterally between the control and select gates 118, 120.

A first interlayer dielectric (ILD) layer 146 is arranged laterally between the control, select, and logic gates 118, 120, 122 and, in some embodiments, has an upper or top surface that is substantially coplanar with the upper or top surfaces of the control, select, and logic gates 118, 120, 122. A second ILD layer 148 is arranged over the first ILD layer 146 and, in some embodiments, has a lower or bottom surface that is substantially coplanar with the upper or top surfaces of the control, select, and logic gates 118, 120, 122. Contacts 150 extend vertically through the first and second ILD layers 146, 148 to one or more of the source/drain regions 134, 136, 138 and/or one or more of the control, select, and logic gates 118, 120, 122.

In operation, the charge trapping layer 130 stores charge and selectively toggles between different amounts of stored charge respectively representing a logic "0" and a logic "1". To read the amount of stored charge, in some embodiments, a bias voltage is applied to the control gate 118, such that a control channel region 140 underlying the control gate 118 selectively conducts depending upon the amount of stored charge. Depending upon whether the control channel region 140 conducts, the charge trapping layer 130 stores a logic "0" or a logic "1". Since the stored charge screens an electric field produced by the control gate 118, the threshold voltage to induce the control channel region 140 to conduct varies with the amount of stored charge. Therefore, the bias voltage is chosen between the threshold voltages at different amounts of stored charge. To add charge to the charge trapping layer 130, in some embodiments, the control and select gates 118, 120 are respectively biased with comparatively high and low voltages to promote hot carrier injection. To remove charge in the charge trapping layer 130, in some embodiments, the control gate 118 is biased with a high voltage of opposite polarity as charge stored in the charge trapping layer 130 to promote Fowler-Nordheim tunneling (FNT) of the charge out of the charge trapping layer 130.

While the memory cell 102 and the logic device 112 were described as using metal for the logic gate 122 and one or both of the control and select gates 118, 120, it is to be appreciated that another conductive material may be employed. Similarly, while the ones of the logic, control, and select dielectric regions 124, 126, 128 corresponding to gates that are metal were described as being or otherwise comprising a layer of high κ dielectric material, another dielectric material complementing the other conductive material may be employed. Even more, while the IC was described with regard to an embedded 2T MONOS memory cell, other types of embedded memory cells are amenable.

Figure 2A:
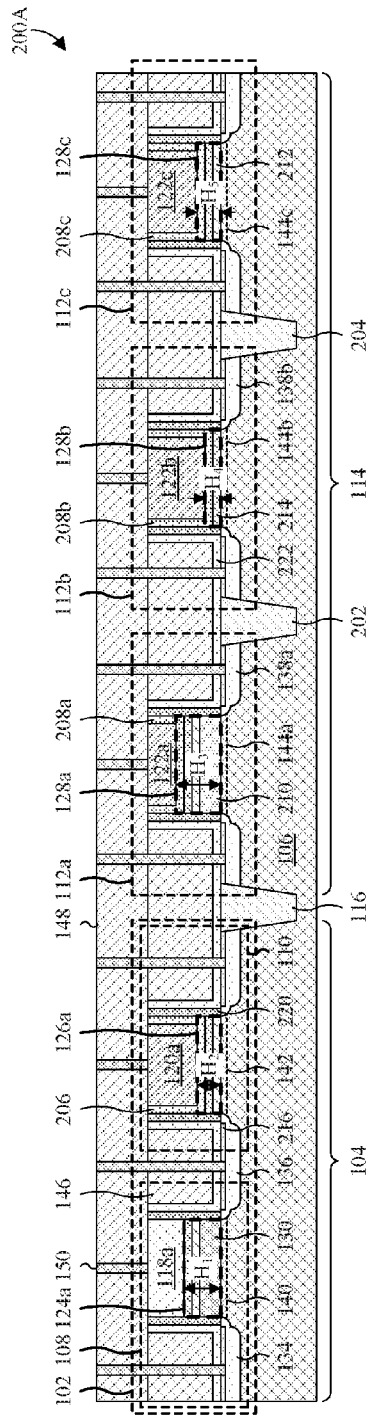
FIG. 2A illustrates a cross-sectional view of some more detailed embodiments of the IC of FIG. 1 in which a select gate is metal.

With reference to FIG. 2A, a cross-sectional view 200A of some more detailed embodiments of the IC of FIG. 1. As illustrated, a memory cell 102 is arranged on a memory region 104 of a semiconductor substrate 106, and a plurality of logic devices 112a, 112b, 112c is arranged on a logic region 114 of the semiconductor substrate 106. The memory cell 102 may be, for example, a 2T MONOS memory cell, and/or may comprise, for example, a control transistor 108 and a select transistor 110. The semiconductor substrate 106 may be, for example, a bulk semiconductor substrate, such as a bulk silicon substrate, or a silicon-on-insulator (SOI) substrate. The logic devices 112a-112c may comprise, for example, a first logic device 112a, a second logic device 112b, a third logic device 112c, or a combination of the foregoing. The first logic device 112a may be, for example, a high voltage transistor, the second logic device 112b may be, for example, a single-gate-oxide transistor, and the third logic device 112c may be, for example, a dual-gate-oxide transistor.

The memory region 104 and the logic region 114 are laterally adjacent to one another and, in some embodiments, spaced from one another by a first isolation region 116. Further, in some embodiments, the logic devices 112a-112c are laterally spaced from one another by second isolation regions 202, 204. The first and/or second isolation regions 116, 202, 204 may be, for example, shallow trench isolation (STI) regions, deep trench isolation (DTI) regions, implant isolation regions, or a combination of the foregoing.

Respective gates 118a, 120a, 122a, 122b, 122c of the memory cell 102 and the logic devices 112a-112c are arranged over and vertically spaced from the semiconductor substrate 106 by respective dielectric regions 124a, 126a, 128a, 128b, 128c. In some embodiments, upper or top surfaces of the gates 118a, 120a, 122a-122c are substantially coplanar. Further, in some embodiments, heights of the gates 118a, 120a, 122a-122c vary. The gates 118a, 120a, 122a-122c comprise a control gate 118a and a select gate 120a arranged laterally adjacent to one another and both corresponding to the memory cell 102. Further, the gates 118a, 120a, 122a-122c comprise logic gates 122a-122c corresponding to the logic devices 112a-112c. The logic gates 122a-122c and the select gate 120a are metal, whereas the control gate 118a is another material, such as, for example, polysilicon or some other non-metal. The metal may be or otherwise comprise, for example, titanium, tantalum, tungsten, copper, or aluminum copper.

The dielectric regions 124a, 126a, 128a-128c are arranged between the gates 118a, 120a, 122a-122c and the semiconductor substrate 106 to insulate and space the gates 118a, 120a, 122a-122c from the semiconductor substrate 106. In some embodiments, the dielectric regions 124a, 126a, 128a-128c comprise substantially coplanar lower or bottom surfaces and/or have varying heights $H_1$, $H_2$, $H_3$, $H_4$, $H_5$. The dielectric regions 124a, 126a, 128a-128c comprise a control dielectric region 124a, a select dielectric region 126a, and logic dielectric regions 128a-128c corresponding to the control, select, and logic gates 118a, 120a, 122a-122c.

The select and logic dielectric regions 126a, 128a-128c comprise respective high κ layers 206, 208a, 208b, 208c lining lower or bottom surfaces of the select and logic gates 120a, 122a-122c. In some embodiments, the high κ layers 206, 208a-206c further line sidewall surfaces of the select and logic gates 120a, 122a-122c and/or directly abut the select and logic gates 120a, 122a-122c. The high κ layers 206, 208a-208c may, for example, be or otherwise comprise hafnium oxide, hafnium silicon oxide, hafnium aluminum oxide, hafnium tantalum oxide, zirconium silicate, or zirconium oxide.

The control dielectric region 124a comprises a charge trapping layer 130 configured to store charge. In some embodiments, the charge trapping layer 130 is or otherwise comprises an oxide-nitride-oxide (ONO) structure or an oxide-nanocrystal-oxide (ONCO) structure. The ONO structure may comprise, for example, a first oxide layer, a nitride layer arranged over and abutting the first oxide layer, and a second oxide layer arranged over and abutting the nitride layer. The first and second oxide layers may be, for example, silicon dioxide, and/or the nitride layer may be, for example, silicon nitride. The ONCO structure may comprise, for example, the first oxide layer, a layer of nanocrystals arranged over and abutting the first oxide layer, and the second oxide layer arranged over and abutting the layer of nanocrystals. The layer of nanocrystals may be, for example, a layer of silicon dots.

In some embodiments, the dielectric regions 124a, 126a, 128a-128c respectively comprise dielectric layers 210, 212, 214 underlying the high κ layers 206, 208a-208c and/or overlying the charge trapping layer 130. For example, a first logic dielectric region 128a may comprise a first dielectric layer 210. As another example, the control and select dielectric regions 124a, 126a and first and third logic dielectric regions 128a, 128c may respectively comprise second dielectric layers 212. As yet another example, the control and select dielectric regions 124a, 126a and first, second, and third logic dielectric regions 128a-128c may respectively comprise third dielectric layers 214. The first, second, and third dielectric layers 210, 212, 214 may be, for example, silicon dioxide or silicon nitride.

Respective source/drain regions 134, 136, 138a, 138b of the gates 118a, 120a, 122a-122c are arranged in an upper surface the semiconductor substrate 106. The source/drain regions 134, 136, 138a, 138b are arranged on opposite sides of the gates 118a, 120a, 122a-122c and define respective channel regions 140, 142, 144a, 144b, 144c of the gates 118a, 120a, 122a-122c under the gates 118a, 120a, 122a-122c. The channel regions 140, 142, 144a-144c selectively conduct depending upon biases applied to the gates 118a, 120a, 122a-122c. In some embodiments, the control and select gates 118a, 120a share a source/drain region 136 arranged laterally between the control and select gates 118a, 120a. The source/drain regions 134, 136, 138a, 138b may be, for example, doped regions having an opposite doping type (n- or p-type) as surrounding regions of the semiconductor substrate 106. Further, the source/drain regions 134, 136, 138a, 138b may be, for example, covered by silicide layers 216. In some embodiments, the silicide layers 216 are nickel silicide or titanium silicide.

In some embodiments, a main sidewall structure 220 and/or a contact etch stop layer (CESL) 222 line sidewalls of the gates 118a, 120a, 122a-122c. Further, in some embodiments, the CESL 222 extends laterally to cover the source/drain regions 134, 136, 138a, 138b, and/or to cover the first and/or second isolation regions 116, 202, 204. Even more, in some embodiments, the main sidewall structure 220 is arranged laterally between the CESL 222 and the gates 118a, 120a, 122a-122c, and/or is arranged laterally between the CESL 222 and the high κ layers 206, 208a-208c. Moreover, in some embodiments, upper or top surfaces of the main sidewall structure 220 and/or the CESL 222 are substantially coplanar with the upper or top surfaces of the gates 118a, 120a, 122a-122c. The main sidewall structure 220 and/or the CESL 222 may be, for example, silicon dioxide, silicon nitride, or some other dielectric.

A first ILD layer 146 is arranged laterally between the gates 118a, 120a, 122a-122c and, in some embodiments, has an upper or top surface that is substantially coplanar with the upper or top surfaces of the gates 118a, 120a, 122a-122c. A second ILD layer 148 is arranged over the first ILD layer 146 and, in some embodiments, has a lower or bottom surface that is substantially coplanar with the upper or top surfaces of the gates 118a, 120a, 122a-122c. The first and/or second ILD layers 146, 148 may be, for example, an oxide, polysilicate glass (PSG), a dielectric material with a dielectric constant less about 3.9 (i.e., a low κ dielectric material), or some other dielectric material. Contacts 150 extend vertically through the first and second ILD layers 146, 148 to one or more of the source/drain regions 134, 136, 138a, 138b and/or one or more of the gates 118a, 120a, 122a-122c. The contacts 150 may be, for example, tungsten, copper, aluminum copper, or some other conductive material.

Figure 2B:
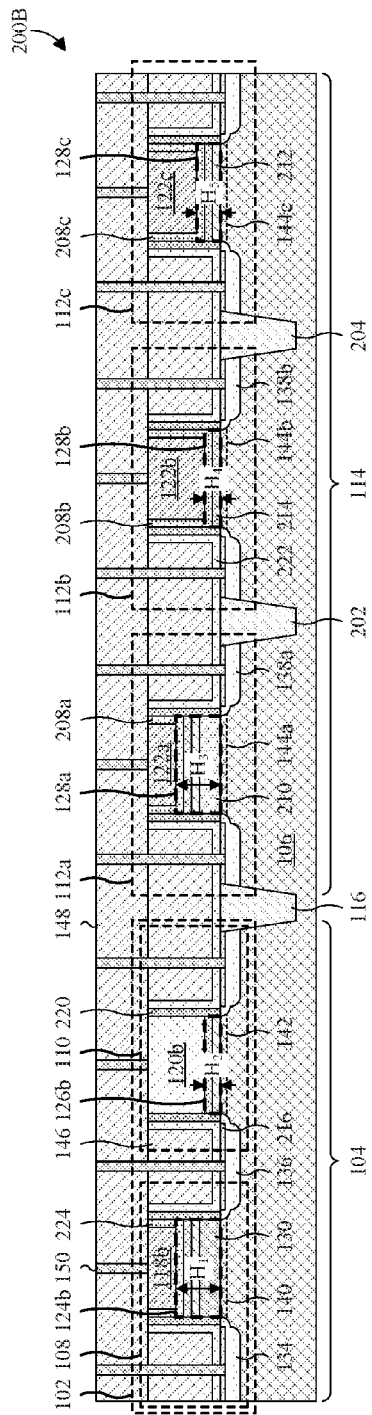
FIG. 2B illustrates a cross-sectional view of some more detailed embodiments of the IC of FIG. 1 in which a control gate is metal.

With reference to FIG. 2B, a cross-sectional view 200B of some more detailed embodiments of the IC of FIG. 1. As illustrated, logic gates 122a, 122b, 122c and a control gate 118b are metal, whereas a select gate 120b is another material, such as, for example, polysilicon or some other non-metal. The control, select, and logic gates 118*b*, 120*b*, 122*a*-122*c* are arranged over and spaced from a semiconductor substrate 106 respectively by a control dielectric region 124*b*, a select dielectric region 126*b*, and logic dielectric regions 128*a*-128*c*. The control and logic dielectric regions 124, 128*a*-128*c* comprise respective high κ layers 224, 208*a*, 208*b*, 208*c* lining lower or bottom surfaces of the control and logic gates 118*b*, 122*a*-122*c*. In some embodiments, the high κ layers 224, 208*a*-208*c* further line sidewall surfaces of the control and logic gates 118*b*, 122*a*-122*c*, and/or directly abut the control and logic gates 118*b*, 122*a*-122*c*. Further, in some embodiments, the high κ layers 208*a*-208*c*, 224 are or otherwise comprise hafnium oxide, hafnium silicon oxide, hafnium aluminum oxide, hafnium tantalum oxide, zirconium silicate, or zirconium oxide.

Figure 2C:
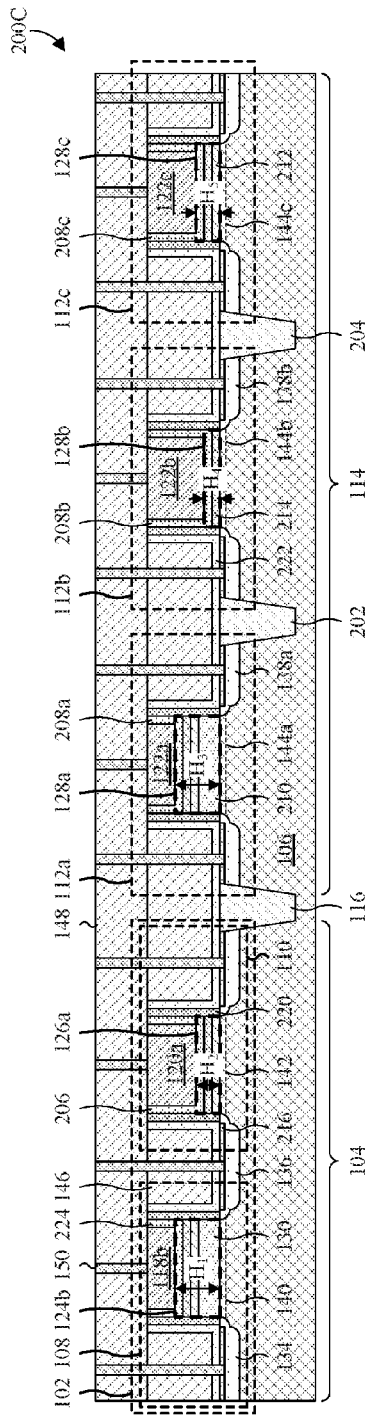
FIG. 2C illustrates a cross-sectional view of some more detailed embodiments of the IC of FIG. 1 in which a control gate and a select gate are both metal.

With reference to FIG. 2C, a cross-sectional view 200C of some more detailed embodiments of the IC of FIG. 1. As illustrated, logic gates 122*a*, 122*b*, 122*c*, a control gate 118*b*, and a select gate 120*a* are metal. The control, select, and logic gates 118*b*, 120*a*, 122*a*-122*c* are arranged over and spaced from a semiconductor substrate 106 by a control dielectric region 124*b*, a select dielectric region 126*a*, and logic dielectric regions 128*a*-128*c*. The control, select, and logic dielectric regions 124, 126, 128*a*-128*c* comprise respective high κ layers 224, 206, 208*a*, 208*b*, 208*c* lining lower or bottom surfaces of the control, select, and logic gates 118*b*, 120*a*, 122*a*-122*c*.

While the memory cell 102 and the logic devices 112*a*-112*c* were described as using metal for the logic gates 122*a*-122*c* and for one or both of the control and select gates 118*a*, 118*b*, 120*a*, 120*b*, it is to be appreciated that another conductive material may be employed. Similarly, while the ones of the control, select, and logic dielectric regions 124*a*, 124*b*, 126*a*, 126*b*, 128*a*-128*c* corresponding to gates that are metal were described as comprising a high κ dielectric material, another dielectric material complementing the other conductive material may be employed. Even more, while FIGS. 2A-2C are illustrated with multiple logic devices 112*a*-112*c*, more or less logic devices are amenable.

With reference to FIGS. 3-17, 18A, 18B, 18C, 19-22, a series of cross-sectional views of some embodiments of a high-κ-last method for manufacturing an IC with an embedded MONOS memory cell is provided.

As illustrated by the cross-sectional view 300 of FIG. 3, a first isolation region 116 is formed on an upper side of a semiconductor substrate 106 to laterally space a memory region 104 of the semiconductor substrate 106 from a logic region 114 of the semiconductor substrate 106. Further, one or more second isolation regions 202, 204 are formed on the upper side of the semiconductor substrate 106 to divide the logic region 114 into logic device regions 302, 304, 306. The logic device regions 302, 304, 306 may, for example, correspond to different device types, such as high voltage transistors and dual-gate-oxide transistors. In some embodiments, the first and second isolation regions 116, 202, 204 are formed concurrently. Further, in some embodiments, the process for forming the first and/or second isolation regions 116, 202, 204 comprises etching into the semiconductor substrate 106 to form trenches and subsequently filling the trenches with a dielectric material.

As illustrated by the cross-sectional view 400 of FIG. 4, a charge trapping layer 130 is formed covering the semiconductor substrate 106 and the first and second isolation regions 116, 202, 204. In some embodiments, the charge trapping layer 130 comprises a first oxide layer 402, a nitride or nanocrystal layer 404 arranged over the first oxide layer 402, and a second oxide layer 406 arranged over the nitride or nanocrystal layer 404. The first and second oxide layers 402, 406 may be, for example, silicon dioxide, and/or the nitride or nanocrystal layer 404 may be, for example, silicon nitride or silicon nanocrystals. Further, in some embodiments, the nitride or nanocrystal layer 404 is arranged directly on the first oxide layer 402, and/or the second oxide layer 406 is arranged directly on the nitride or nanocrystal layer 404. The process for forming the charge trapping layer 130 may, for example, comprise sequentially forming the first oxide layer 402, the nitride or nanocrystal layer 404, and the second oxide layer 406. The first and second oxide layers 402, 406 and the nitride or nanocrystal layer 404 may be formed by, for example, thermal oxidation, chemical vapor deposition (CVD), physical vapor deposition (PVD), atomic layer deposition (ALD), or a combination of the foregoing.

As illustrated by the cross-sectional view 500 of FIG. 5, a first etch is performed into the charge trapping layer 130. The first etch localizes the charge trapping layer 130 to a control transistor region 502 of the memory region 104 that is laterally adjacent to a select transistor region 504 of the memory region 104. The process for performing the first etch may, for example, comprise depositing and patterning a first photoresist layer 506 over the charge trapping layer 130 so as to mask a region of the charge trapping layer 130 localized to the control transistor region 502. Further, the process may, for example, comprise applying one or more etchants 508 to the charge trapping layer 130 while using the first photoresist layer 506 as a mask. Even more, the process may comprise, for example, subsequently removing or otherwise stripping the first photoresist layer 506.

Figure 6:
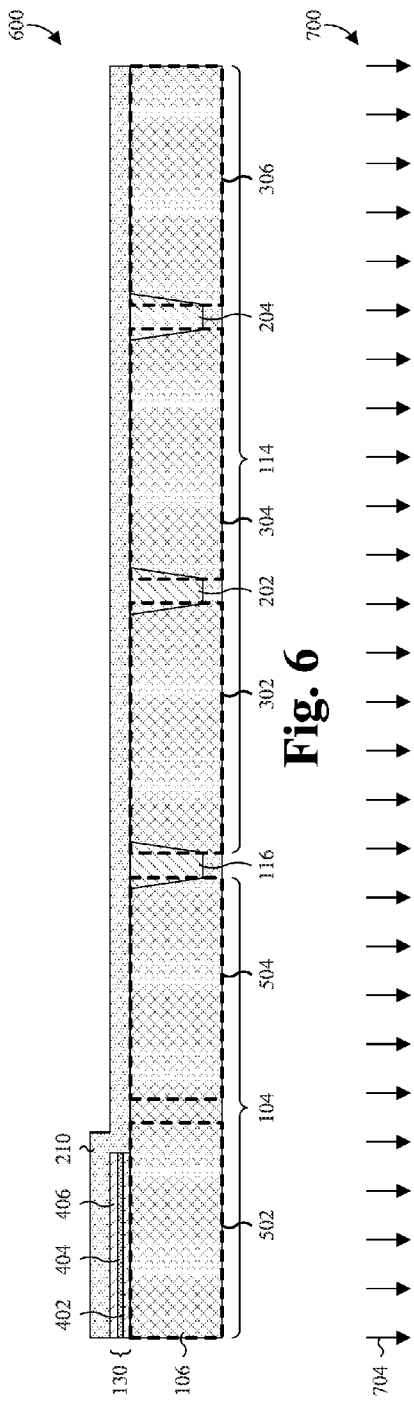

As illustrated by the cross-sectional view 600 of FIG. 6, a first dielectric layer 210 is formed covering the charge trapping layer 130 and exposed regions of the semiconductor substrate 106. The first dielectric layer 210 may be, for example, silicon dioxide or some other oxide. Further, the first dielectric layer 210 may be formed by, for example, one or more of thermal oxidation, CVD, PVD, or ALD. In some embodiments, the first dielectric layer 210 is formed conformally (e.g., with a substantially uniform thickness).

Figure 7:
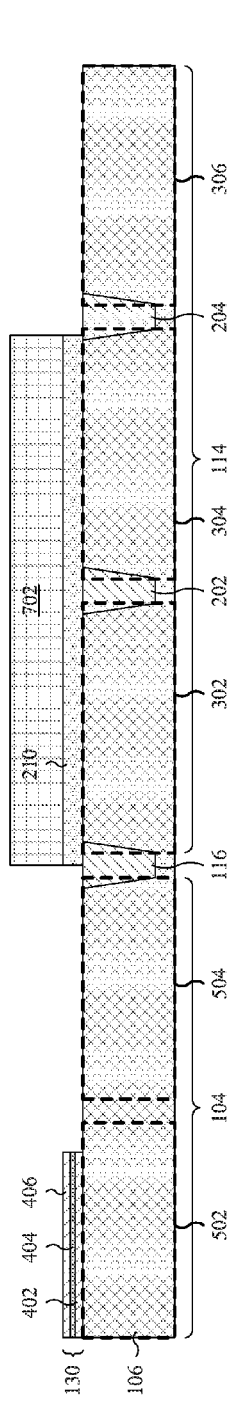

As illustrated by the cross-sectional view 700 of FIG. 7, a second etch is performed into the first dielectric layer 210 to localize the first dielectric layer 210 to first and second logic device regions 302, 304. The process for performing the second etch may, for example, comprise depositing and patterning a second photoresist layer 702 over the first dielectric layer 210 so as to mask a region of the first dielectric layer 210 localized to the first and second logic device regions 302, 304. Further, the process may comprise, for example, applying one or more etchants 704 to the first dielectric layer 210 while using the second photoresist layer 702 as a mask. Even more, the process may comprise, for example, subsequently removing or otherwise stripping the second photoresist layer 702.

Figure 8:
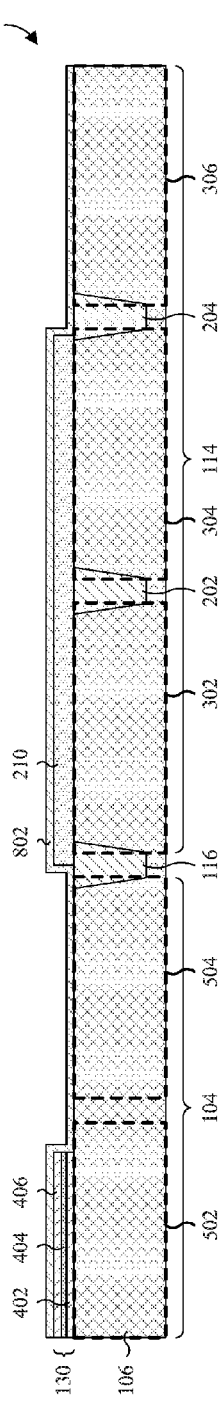

As illustrated by the cross-sectional view 800 of FIG. 8, a second dielectric layer 802 is formed lining the charge trapping layer 130, the first dielectric layer 210, and exposed regions of the semiconductor substrate 106. The second dielectric layer 802 may be, for example, silicon dioxide or some other oxide. Further, the second dielectric layer 802 may be formed by, for example, one or more of thermal oxidation, CVD, PVD, or ALD. In some embodiments, the second dielectric layer 802 is formed conformally.

As illustrated by the cross-sectional view 900 of FIG. 9, a third etch is performed into the first and second dielectric layers 210, 802 to expose a second logic device region 304 between first and third logic device regions 302, 306. The process for performing the third etch may comprise, for example, depositing and patterning a third photoresist layer 902 over regions of the second dielectric layer 802 laterally surrounding the second logic device region 304. Further, the process may comprise, for example, applying one or more etchants 904 to the first and second dielectric layers 210, 802 while using the third photoresist layer 902 as a mask. Even more, the process may comprise, for example, subsequently removing or otherwise stripping the third photoresist layer 902.

As illustrated by the cross-sectional view 1000 of FIG. 10, a third dielectric layer 1002 is formed lining the second dielectric layer 802 and the second logic device region 304. The third dielectric layer 1002 may be, for example, silicon dioxide. Further, the third dielectric layer 1002 may be formed by, for example, one or more of thermal oxidation, CVD, PVD, or ALD. In some embodiments, the third dielectric layer 1002 is formed conformally.

Also illustrated by the cross-sectional view 1000 of FIG. 10, a first conductive layer 1004 is formed lining the third dielectric layer 1002. The first conductive layer 1004 may be, for example, polysilicon (e.g., doped polysilicon) or some other conductive material. Further, the first conductive layer 1004 may be formed by, for example, one or more of CVD, PVD, or ALD. In some embodiments, the first conductive layer 1004 is formed conformally.

Figures 11, 12:
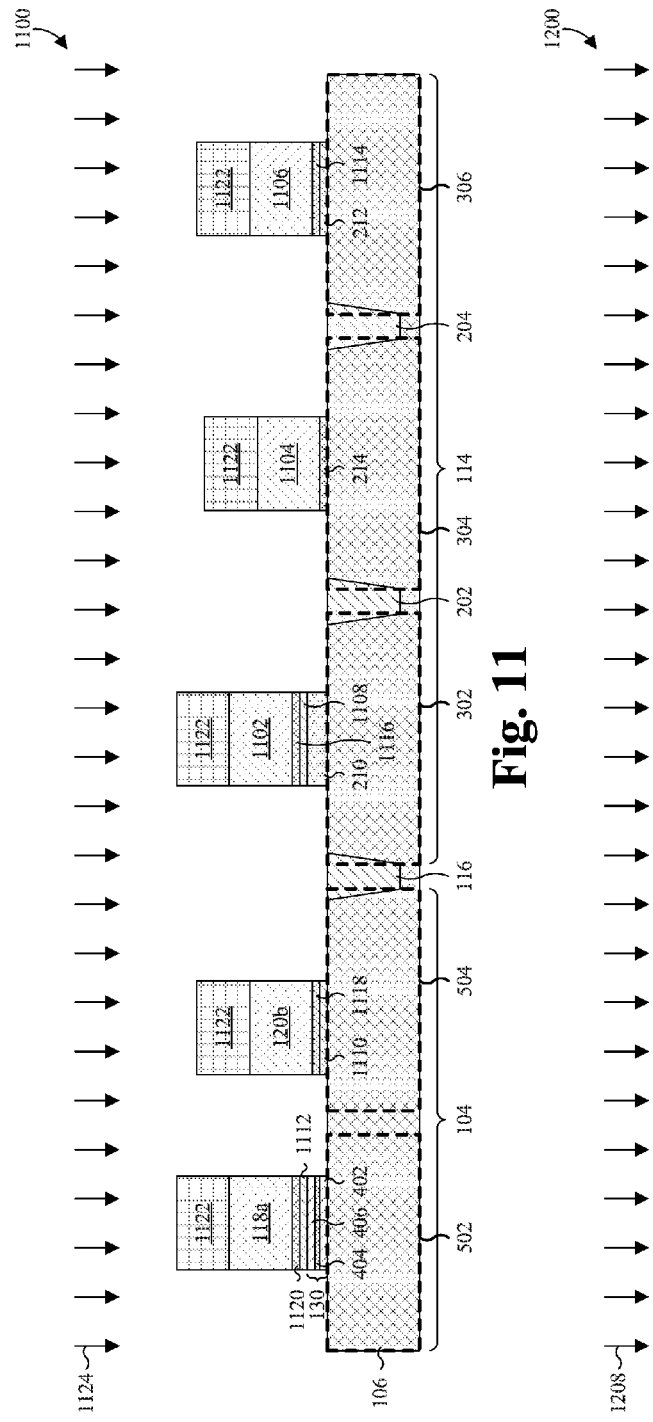

As illustrated by the cross-sectional view 1100 of FIG. 11, a fourth etch is performed into the charge trapping layer 130, the first conductive layer 1004 (see, e.g., FIG. 10), and the first, second, and third dielectric layers 210, 802, 1002 (see, e.g., FIG. 10). The fourth etch forms a control gate 118a and a select gate 120b respectively over the control and select transistor regions 502, 504, as well as first, second, and third logic gates 1102, 1104, 1106 respectively over the first, second, and third logic device regions 302, 304, 306. Further, the fourth etch localizes the charge trapping layer 130 to under the control gate 118a and localizes the first dielectric layer 210 to under the first logic gate 1102. Even more, the fourth etch divides the second dielectric layer 802 into multiple second dielectric layers 212, 1108, 1110, 1112 individual to and under the third and first logic gates 1106, 1102 and the select and control gates 120b, 118a. Moreover, the fourth etch divides the third dielectric layer 1002 into multiple third dielectric layers 214, 1114, 1116, 1118, 1120 individual to and under the second, third, and first logic gates 1104, 1106, 1102 and the select and control gates 120b, 118a.

The process for performing the fourth etch may comprise, for example, depositing and patterning a fourth photoresist layer 1122 over regions of the first conductive layer 1004 corresponding to the gates. Further, the process may comprise, for example, applying one or more etchants 1124 to the charge trapping layer 130, the first conductive layer 1004, and the first, second, and third dielectric layers 210, 802, 1002 while using the fourth photoresist layer 1122 as a mask. Even more, the process may comprise subsequently removing or otherwise stripping the fourth photoresist layer 1124.

As illustrated by the cross-sectional view 1200 of FIG. 12, lightly-doped drain (LDD) regions 1202, 1204, 1206 are formed in exposed regions of the semiconductor substrate 106. In some embodiments, the LDD regions 1202, 1204, 1206 are formed by implanting ions 1208 into the semiconductor substrate 106 by, for example, ion implantation.

Figure 13:
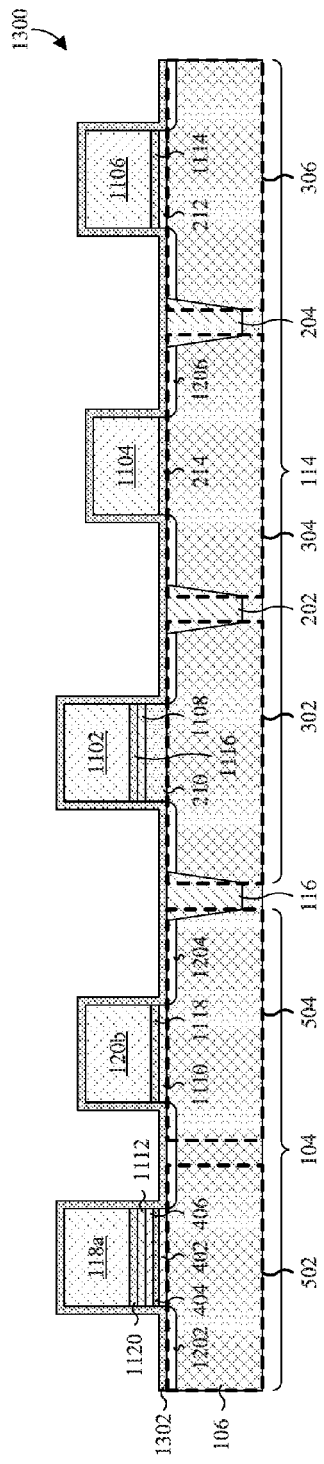

As illustrated by the cross-sectional view 1300 of FIG. 13, a sidewall layer 1302 is formed lining: the first, second, and third logic gates 1102, 1104, 1106; the control and select 118a, 120b; and the LDD regions 1202, 1204, 1206. The sidewall layer 1302 may be, for example, silicon dioxide, silicon nitride, or some other dielectric. Further, the sidewall layer 1302 may be formed by, for example, one or more of thermal oxidation, CVD, PVD, or ALD. In some embodiments, the sidewall layer 1302 is formed conformally.

Figure 14:
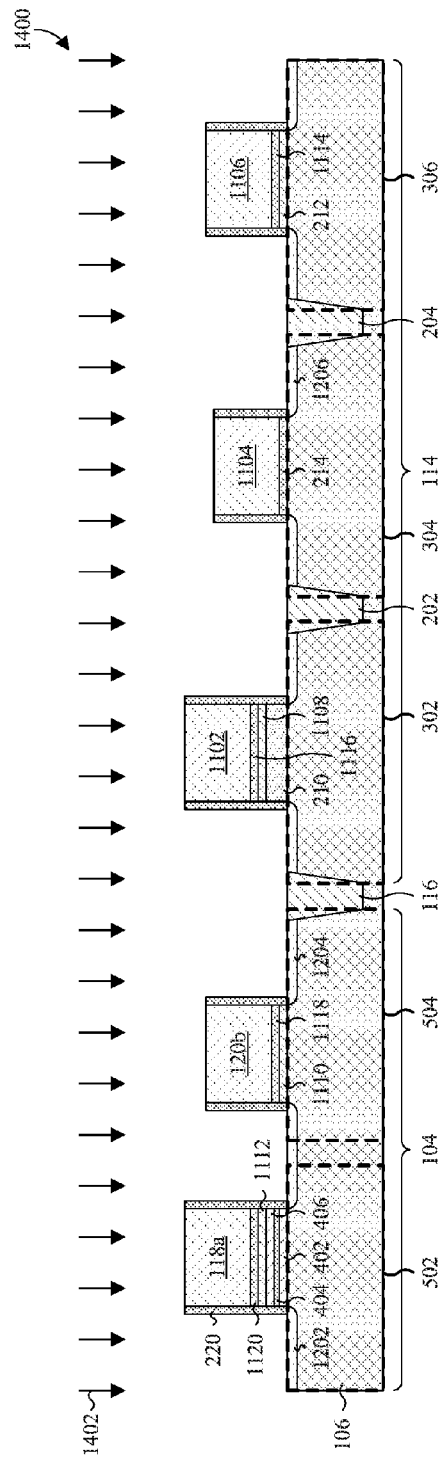

As illustrated by the cross-sectional view 1400 of FIG. 14, the sidewall layer 1302 is etched back to form a main sidewall structure 220 lining sidewalls of the first, second, and third logic gates 1102, 1104, 1106 and the control and select 118a, 120b. In some embodiments, the main sidewall structure 220 is confined to sidewalls (i.e., is devoid of lateral extensions). The process for performing the etch back may comprise, for example, applying one or more etchants 1402 to the sidewall layer 1302 for the approximate time it takes the etchant(s) 1402 to etch through a thickness of the sidewall layer 1302.

As illustrated by the cross-sectional view 1500 of FIG. 15, source/drain regions 134, 136, 138a, 138b, which include the LDD regions 1202, 1204, 1206 (see, e.g., FIG. 14), are formed. In some embodiments, the source/drain regions 134, 136, 138a, 138b are formed by implanting ions 1502 into the semiconductor substrate 106 by, for example, ion implantation.

As illustrated by the cross-sectional view 1600 of FIG. 16, in some embodiments, silicide layers 216 are formed on the source/drain regions 134, 136, 138a, 138b. The process for forming the silicide layers 216 may comprise, for example, a nickel silidation process. Further, the process for forming the silicide layers 216 may comprise, for example, forming a resist protect oxide (RPO) layer covering surfaces surrounding the source/drain regions 134, 136, 138a, 138b to block silicide from forming on these surfaces.

Also illustrated by the cross-sectional view 1600 of FIG. 16, a CESL 222 is formed lining: the main sidewall structure 220; upper or top surfaces of the first, second, and third logic gates 1102, 1104, 1106 and of the control and select gates 118a, 120b; and the source/drain regions 134, 136, 138a, 138b. The CESL 222 may be, for example, silicon dioxide, silicon nitride, or some other dielectric. Further, the CESL 222 may be formed by, for example, one or more of thermal oxidation, CVD, PVD, or ALD. In some embodiments, the CESL 222 is formed conformally.

Also illustrated by the cross-sectional view 1600 of FIG. 16, a first ILD layer 146 is formed covering the CESL 222. The first ILD layer 146 may be, for example, an oxide, PSG, a low κ dielectric, or some other dielectric. Further, the first ILD layer 146 may be formed by, for example, one or more of CVD or PVD.

As illustrated by the cross-sectional view 1700 of FIG. 17, a first planarization is performed into the first ILD layer 146, the main sidewall structure 220, and the CESL 222 to expose the upper or top surfaces of the first, second, and third logic gates 1102, 1104, 1106 and of the control and select gates 118a, 120b. The first planarization may be performed by, for example, a chemical mechanical polish (CMP) and/or an etch back.

As illustrated by the cross-sectional view 1800A of FIG. 18A, a fifth etch is performed into the first, second, and third logic gates 1102, 1104, 1106 (see, e.g., FIG. 17) and the select gate 120b (see, e.g., FIG. 17) to remove the gates 120b, 1102, 1104, 1106 and to form respective gate openings 1802, 1804, 1806. The process for performing the fifth etch may comprise, for example, depositing and patterning a fifth photoresist layer 1808a covering the control gate 118a. Further, the process may comprise, for example, applying one or more etchants 1810 to the first, second, and third logic gates 1102, 1104, 1106 and the select gate 120b while using the fifth photoresist layer 1808*a* as a mask. Further, the process may comprise, for example, subsequently removing or otherwise stripping the fifth photoresist layer 1808*a*.

Figure 18B:
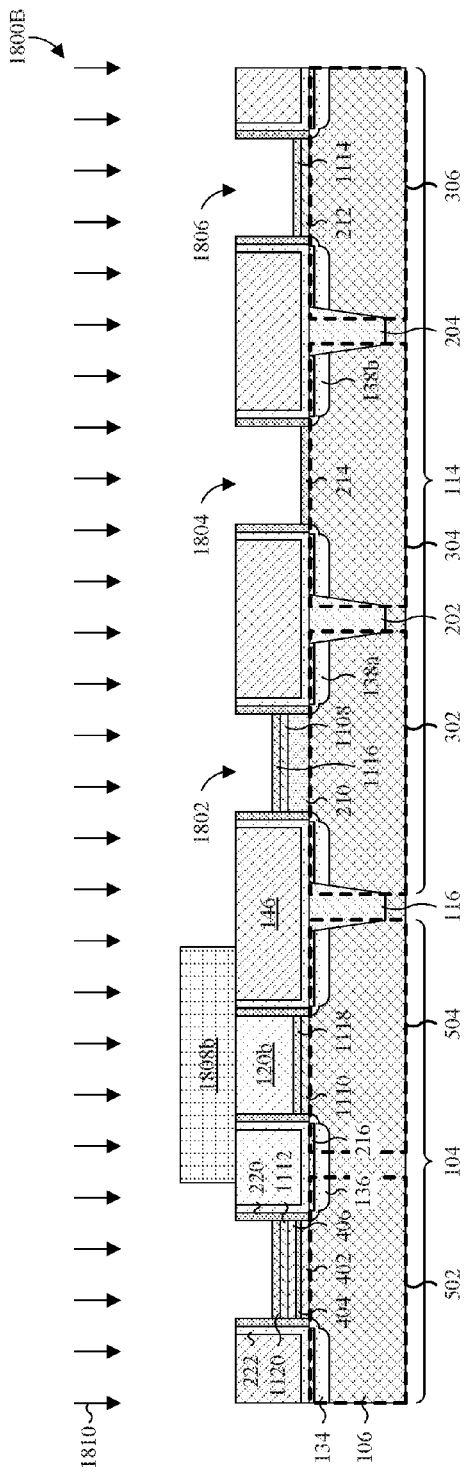

As illustrated by the cross-sectional view 1800B of FIG. 18B, the fifth etch may alternatively be performed into the first, second, and third logic gates 1102, 1104, 1106 (see, e.g., FIG. 17) and the control gate 118*a* (see, e.g., FIG. 17) to remove the gates 118*a*, 1102, 1104, 1106 and to form respective gate openings 1802, 1804, 1806. The process for performing the fifth etch may comprise, for example, depositing and patterning a fifth photoresist layer 1808*b* to cover the select gate 120*b*. Further, the process may comprise, for example, applying one or more etchants 1810 to the first, second, and third logic gates 1102, 1104, 1106 and the control gate 118*a* while using the fifth photoresist layer 1808*b* as a mask. Further, the process may comprise, for example, subsequently removing the fifth photoresist layer 1808*b*.

Figure 18C:
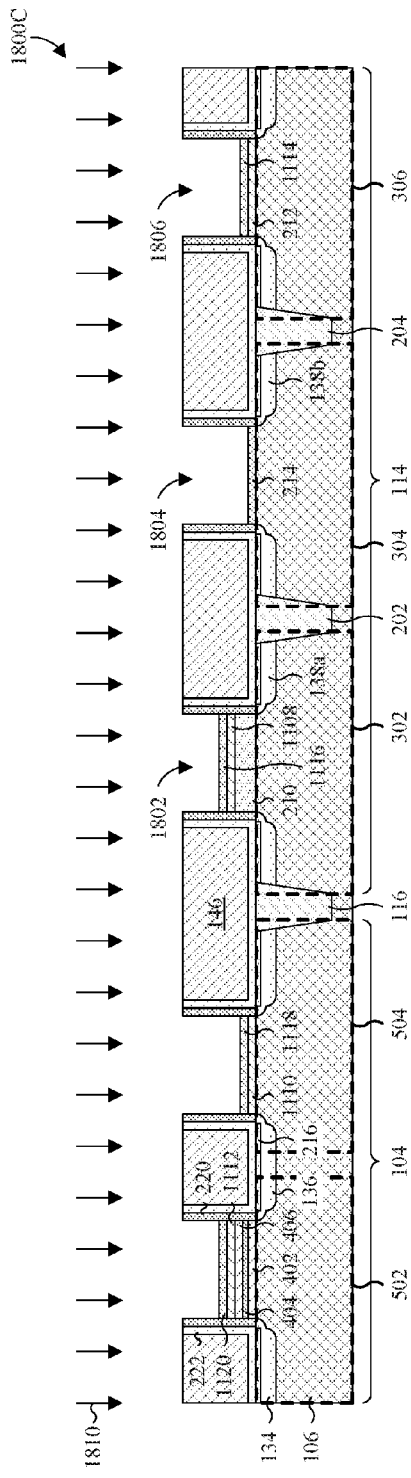

As illustrated by the cross-sectional view 1800C of FIG. 18C, the fifth etch may alternatively be performed into the first, second, and third logic gates 1102, 1104, 1106 (see, e.g., FIG. 17) and both of the control and select gates 118*a*, 120*b* (see, e.g., FIG. 17) to remove the gates 118*a*, 120*b*, 1102, 1104, 1106 and to form respective gate openings 1802, 1804, 1806. The process for performing the fifth etch may comprise, for example, applying one or more etchants 1810 to the first, second, and third logic gates 1102, 1104, 1106 and to the control and select gates 118*a*, 120*b*.

Hereafter, FIGS. 19-22 illustrate additional processing performed after the fifth etch. As will be seen, FIGS. 19-22 describe the additional processing with regard to a semiconductor structure resulting from the fifth etch of FIG. 18A. However, it is to be appreciated that the additional processing may also be applied to the semiconductor structure resulting from the fifth etch of FIG. 18B or FIG. 18C.

Figure 19:
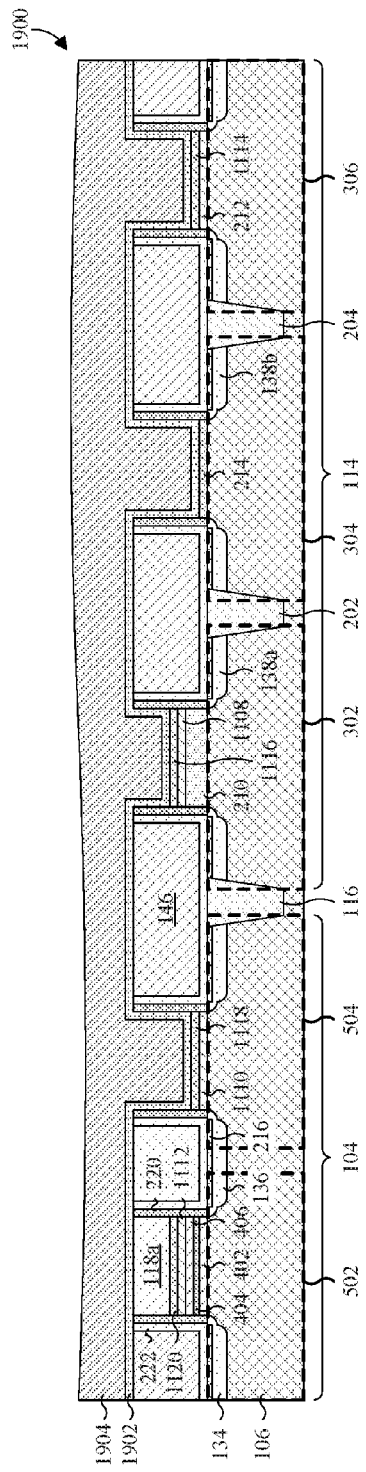
Figure 20:
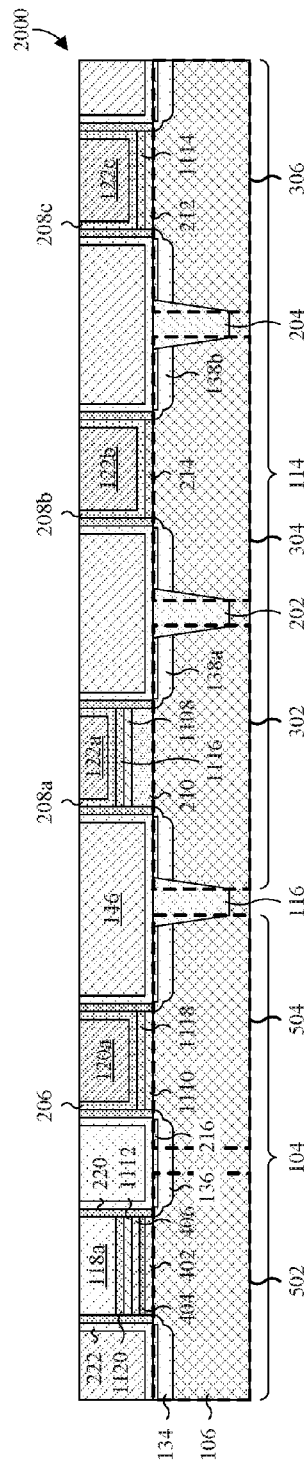

As illustrated by the cross-sectional view 1900 of FIG. 19, a high κ layer 1902 is formed lining the gate openings 1802, 1804, 1806 (see, e.g., FIGS. 18A-18C) previously occupied by the first, second, and third logic gates 1102, 1104, 1106 (see, e.g., FIG. 17) and one or both of the control and select gates 118*a*, 120*b* (see, e.g., FIG. 17). The high κ layer 1902 has a dielectric constant κ exceeding about 3.9 and may be, for example, hafnium oxide. Further, the high κ layer 1902 may be formed by, for example, CVD, PVD, ALD, or a combination of the foregoing. In some embodiments, the high κ layer 1902 is formed conformally.

Also illustrated by the cross-sectional view 1900 of FIG. 19, a second conductive layer 1904 is formed covering the high κ layer 1902 and in the gate openings 1802, 1804, 1806 (see, e.g., FIG. 18). The second conductive layer 1904 is a different material than the first conductive layer 1004 (see, e.g., FIG. 10) and may be, for example, copper, tungsten, aluminum, or some other metal. Further, the second conductive layer 1904 may be formed by, for example, CVD, PVD, ALD, or a combination of the foregoing.

As illustrated by the cross-sectional view 2000 of FIG. 2000, a second planarization is performed into the second conductive layer 1904 (see, e.g., FIG. 19) and the high κ layer 1902 (see, e.g., FIG. 19) to about even with an upper surface of the first ILD layer 146. The second planarization forms new gates 120*a*, 122*a*, 122*b*, 122*c* in the gate openings 1802, 1804, 1806 (see, e.g., FIGS. 18A-18C), including a new select gate 120*a* and new logic gates 122*a*-122*c*. Further, the second planarization divides the high κ layer 1902 into multiple high κ layer 206, 208*a*, 208*b*, 208*c* individual to and under the new gates 120*a*, 122*a*, 122*b*, 122*c*. Even more, in some embodiments, the second planarization coplanarizes upper or top surfaces of the new gates 120*a*, 122*a*-122*c* and/or of the multiple high κ layer 206, 208*a*-208*c* with upper or top surfaces of the first ILD layer 146 and the control gate 118*a*. The second planarization may be performed by, for example, a CMP and/or etch back.

Figure 21:
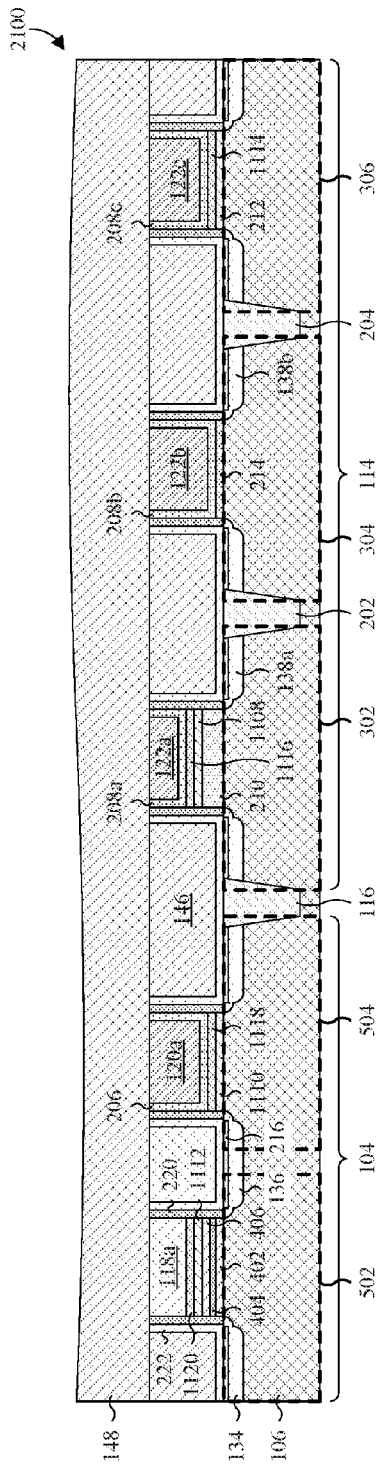

As illustrated by the cross-sectional view 2100 of FIG. 21, a second ILD layer 148 is formed covering the first ILD layer 146, as well as the control gate 118*a* and the new gates 120*a*, 122*a*-122*c*. The second ILD layer 148 may be, for example, an oxide, PSG, or a low κ dielectric. Further, the second ILD layer 148 may be formed by, for example, CVD or PVD.

Figure 22:
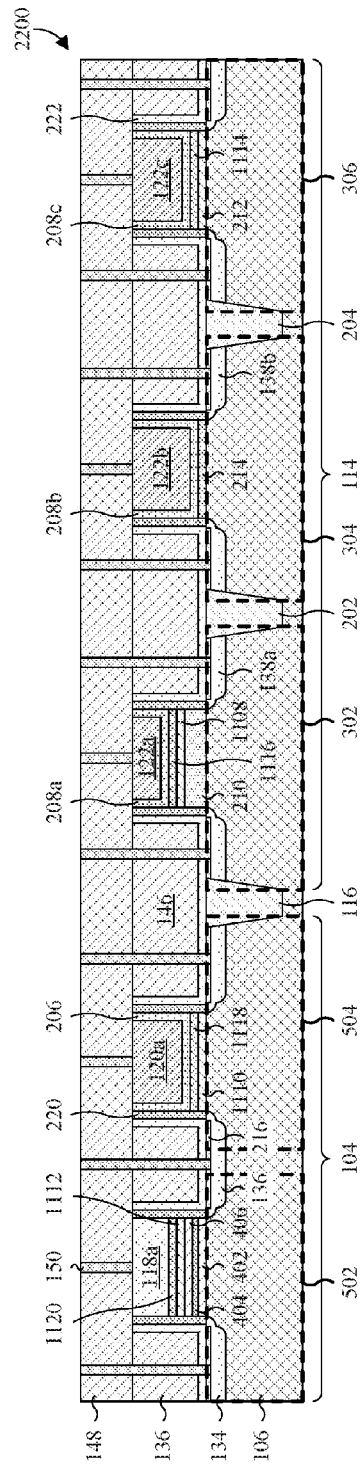

As illustrated by the cross-sectional view 2200 of FIG. 22, a third planarization is performed into the second ILD layer 148. The third planarization may be performed by, for example, a CMP and/or an etch back.

Also illustrated by the cross-sectional view 2200 of FIG. 22, contacts 150 are formed extending through the first and second ILD layers 146, 148 to the source/drain regions 134, 136, 138*a*, 138*b*. Additionally, or alternatively, the contacts 150 are formed extending to the control gate 118*a* and the new gates 120*a*, 122*a*-122*c*. The contacts 150 may be formed of, for example, tungsten, copper, aluminum copper, or some other conductive material. Further, the process for forming the contacts 150 may comprise, for example, performing a sixth etch into the first and second ILD layers 146, 148 to form contact openings, filling the contact openings with a third conductive layer, and planarizing the third conductive layer to coplanarize upper surfaces of the second ILD layer 148 and the third conductive layer.

Figure 23:
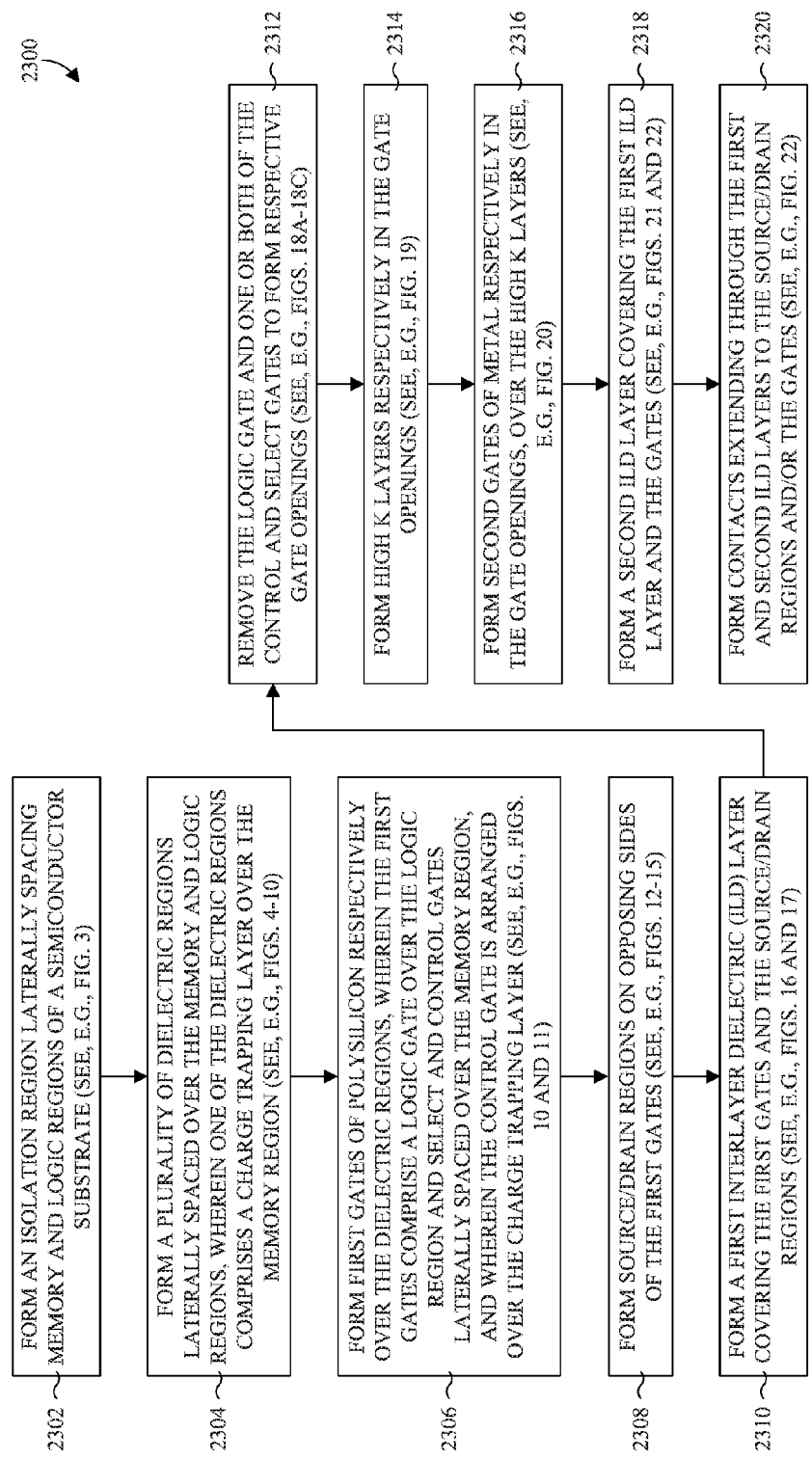
FIG. 23 illustrates a flowchart of some embodiments of the high-κ-last method of FIGS. 3-17, 18A, 18B, 18C, and 19-22.

With reference to FIG. 23, a flowchart 2300 of some embodiments of a high-κ-last method for manufacturing an IC with an embedded MONOS memory cell is provided. The high-κ-last method may, for example, to the series of cross-sectional views illustrated with regard to FIGS. 3-17, 18A, 18B, 18C, and 19-22.

At 2302, an isolation region is formed laterally spacing memory and logic regions of a semiconductor substrate. See, for example, FIG. 3.

At 2304, a plurality of dielectric regions is formed laterally spaced over the memory and logic regions. Further, the plurality of dielectric regions is formed with a region comprising a charge trapping layer over the memory region. In some embodiments, the dielectric regions of the plurality are formed with varying thicknesses. See, for example, FIGS. 4-10.

At 2306, first gates are formed of polysilicon respectively over the dielectric regions. The first gates comprise a logic gate over the logic region, and further comprise select and control gates laterally spaced over the memory region. Further, the control gate is formed over the charge trapping layer. See, for example, FIGS. 10 and 11. In some embodiments, the first gates hereafter undergo thermal processing, such as annealing.

At 2308, source/drain regions are formed on opposing sides of the first gates. See, for example, FIGS. 12-15.

At 2310, a first ILD layer is formed covering the first gates and the source/drain regions. See, for example, FIGS. 16 and 17.

At 2312, the logic gate and one or both of the control and select gates are removed to form respective gate openings. See, for example, FIGS. 18A-18C.

At 2314, high κ layers are respectively formed in the gate openings. The high κ layers have a dielectric constant κ exceeding about 3.9. See, for example, FIG. 19.

At 2316, second gates formed of metal and respectively in the gate openings, over the high κ layers. See, for example, FIG. 20.

At 2318, a second ILD layer is formed covering the first ILD layer and the gates. See, for example, FIGS. 21 and 22.

At 2320, contacts are formed extending through the first and second ILD layers to the source/drain regions and/or to the gates. See, for example, FIG. 22.

By forming the high κ layers and the metal gates last (e.g., after forming the source/drain regions), manufacturing costs are low and process length is short. Further, in embodiments where both the select and control gates are replaced with metal, thermal processing, such as annealing, associated with polysilicon gates may be omitted. This minimizes thermal processes that affect the performance of logic devices under manufacture, thereby allowing the IC to achieve good performance. Even more, by using HKMG technology, the IC achieves good performance, low power consumption, and scaling.

While the method is described as using first gates of polysilicon and second gates of metal, different gate materials may be employed. Moreover, while the method is described as using high κ layers, the high κ layers may be omitted or replaced with a different material. Even more, while the method described by the flowchart 2300 is illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

Thus, as can be appreciated from above, the present disclosure provides an IC comprising a logic device and a memory cell. The logic device is arranged on a semiconductor substrate and comprises a logic gate. The memory cell is arranged on the semiconductor substrate and comprises a control transistor and a select transistor laterally adjacent to one another. The control and select transistors respectively comprise a control gate and a select gate. Further, the control transistor comprises a charge trapping layer underlying the control gate. The logic gate and one or both of the control and select gates are metal and arranged within respective high κ dielectric layers.

In other embodiments, the present disclosure provides a high-κ-last method for manufacturing an IC. A charge trapping layer is formed over a semiconductor substrate. A control gate, a select gate, and a logic gate comprise a first material and are laterally spaced over the semiconductor substrate. The control gate is formed over the charge trapping layer. An ILD layer is formed laterally between the control, select, and logic gates and with an upper surface substantially coplanar with upper surfaces of the control, select, and logic gates. The logic gate and one or both of the control and select gates are removed to form respective gate openings. High κ dielectric layers are formed respectively lining the gate openings. New gates of a second material are formed respectively in the gate openings and over the high κ dielectric layers.

In yet other embodiments, the present disclosure provides an IC comprising a plurality of logic devices, a memory cell, and an ILD layer. The plurality of logic devices is arranged on a logic region of a semiconductor substrate. The logic devices comprise respective dielectric regions and respective logic gates arranged over the respective dielectric regions. Heights of the dielectric regions vary between the dielectric regions. The memory cell is arranged on a memory region of the semiconductor substrate, laterally adjacent to the logic region. The memory cell comprises a control gate and a select gate laterally adjacent to one another. The memory cell further comprises a charge trapping layer underlying the control gate. The ILD layer is arranged laterally between the control, select, and logic gates, and comprises an upper surface substantially coplanar with upper surfaces of the control, select, and logic gates. The logic gates and one or both of the control and select gates are metal and arranged within respective high κ dielectric layers. One of the control and select gates is polysilicon and is not separated from the semiconductor substrate by a high κ dielectric layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit (IC) comprising:
   a logic device arranged on a semiconductor substrate and comprising a logic gate that is metal;
   a memory cell arranged on the semiconductor substrate and comprising a control transistor and a select transistor laterally adjacent to one another, wherein the control and select transistors respectively comprise a control gate and a select gate, wherein the control gate is metal, and wherein the control transistor further comprises a charge trapping layer underlying the control gate; and
   high κ dielectric layers within which the logic gate and the control gate are respectively arranged, wherein the high κ dielectric layers comprise a high κ dielectric layer that has a U-shaped profile directly under the control gate and directly over the charge trapping layer, and wherein the U-shaped profile has inner sidewalls contacting the control gate and outer sidewalls even with sidewalls of the charge trapping layer.

2. The IC according to claim 1, wherein upper surfaces of the high κ dielectric layers are substantially coplanar with upper surfaces of the control, select, and logic gates.

3. The IC according to claim 1, wherein the select gate is polysilicon.

4. The IC according to claim 1, wherein the control and select gates are both metal.

5. The IC according to claim 1, wherein one of the control and select gates is polysilicon and is not separated from the semiconductor substrate by a high κ dielectric layer.

6. The IC according to claim 1, wherein upper surfaces of the control, select, and logic gates are substantially coplanar.

7. The IC according to claim 6, further comprising:
   an interlayer dielectric (ILD) layer arranged laterally between the control and select gates and comprising an upper surface that is substantially coplanar with the upper surfaces of the control, select, and logic gates.

8. The IC according to claim 1, further comprising:
a first source/drain region arranged laterally between the control and select gates; and
second and third source/drain regions corresponding to the control and select gates, and arranged on opposite sides of the corresponding control and select gates as the first source/drain region to define channel regions with the first source/drain region.

9. The IC according to claim 1, further comprising:
a dielectric layer between the high κ dielectric layer and the charge trapping layer, wherein a top surface of the dielectric layer contacts the high κ dielectric layer, wherein a bottom surface of the dielectric layer contacts the charge trapping layer, and wherein the dielectric layer is a different material than the high κ dielectric layer and the charge trapping layer.

10. An integrated circuit (IC) comprising:
a plurality of logic devices arranged on a logic region of a semiconductor substrate, wherein the logic devices comprise respective dielectric regions and respective logic gates arranged over the respective dielectric regions, and wherein heights of the dielectric regions vary between the dielectric regions;
a memory cell arranged on a memory region of the semiconductor substrate, laterally adjacent to the logic region, wherein the memory cell comprises a control gate and a select gate laterally adjacent to one another, and wherein the memory cell further comprises a charge trapping layer underlying the control gate;
an interlayer dielectric (ILD) layer arranged laterally between the control, select, and logic gates, and comprising an upper surface substantially coplanar with upper surfaces of the control, select, and logic gates; and
a plurality of high κ dielectric layers comprising a first high κ dielectric layer and a second high κ dielectric layer, wherein the first high κ dielectric layer is directly under a logic gate of the logic devices and laterally contacts opposite sidewalls of the logic gate, wherein the second high κ dielectric layer is directly under the select gate and laterally contacts opposite sidewalls of the select gate, wherein a bottom surface of the second high κ dielectric layer is vertically spaced from a bottom surface of the first high κ dielectric layer, wherein the high κ dielectric layers further comprise a third high κ dielectric layer lining the control gate and covering the charge trapping layer, wherein inner sidewalls of the third high κ dielectric layer respectively contact outer sidewalls of the control gate, and wherein outer sidewalls of the third high κ dielectric layer are respectively even with outer sidewalls of the charge trapping layer;
wherein the logic gates, the control gate, and the select gate are metal and arranged respectively within the high κ dielectric layers.

11. The IC according to claim 10, wherein opposite sidewalls of the charge trapping layer are respectively even with opposite sidewalls of the control gate.

12. The IC according to claim 10, wherein the memory cell further comprises:
a common source/drain region arranged in the semiconductor substrate, laterally between the control and select gates; and
individual source/drain regions of the control and select gates arranged in the semiconductor substrate, respectively on an opposite side of the control gate as the common source/drain region and an opposite side of the select gate as the common source/drain region.

13. The IC according to claim 10, wherein the memory cell further comprises additional dielectric regions respectively spacing the select gate over the semiconductor substrate and the control gate over the charge trapping layer.

14. The IC according to claim 10, wherein the plurality of logic devices comprise:
a first logic device comprising a first logic gate spaced over the semiconductor substrate by a first dielectric region that has a first thickness;
a second logic device comprising a second logic gate spaced over the semiconductor substrate by a second dielectric region that has a second thickness; and
a third logic device comprising a third logic gate spaced over the semiconductor substrate by a third dielectric region that has a third thickness, wherein the third thickness is greater than the second thickness and less than the first thickness, and wherein the third logic device is arranged on an opposite side of the second logic device as the first logic device.

15. The IC according to claim 10, further comprising:
shallow trench isolation (STI) regions extending into the semiconductor and laterally spacing the memory cell from the logic devices, and further laterally spacing the logic devices from one another.

16. The integrated circuit according to claim 10, further comprising:
a first dielectric layer directly under and contacting the bottom surface of the first high κ dielectric layer, and further contacting the semiconductor substrate; and
a second dielectric layer directly under and contacting the bottom surface of the second high κ dielectric layer, and further contacting the semiconductor substrate, wherein the first and second dielectric layers are different materials than the first and second high κ dielectric layers and have different thicknesses.

17. An integrated circuit (IC) comprising:
a semiconductor substrate comprising a common source/drain region;
a control gate dielectric region and a select gate dielectric region arranged over the semiconductor substrate, wherein the control gate dielectric region comprises a charge trapping layer and a first high κ dielectric layer, wherein the select gate dielectric region comprises a second high κ dielectric layer, wherein a bottom surface of the second high κ dielectric layer is spaced between a top surface of the semiconductor substrate and a bottom surface of the first high κ dielectric layer, and wherein the control and select gate dielectric regions have respective sidewalls that respectively adjoin opposite sides of the common source/drain region;
a select gate electrode, a control gate electrode, and a logic gate electrode laterally spaced over the semiconductor substrate, wherein the control gate electrode is directly over and within the first high κ dielectric layer, wherein the control gate electrode has outer sidewalls respectively and laterally contacting inner sidewalls of the first high κ dielectric layer that are on opposite sides of the first high κ dielectric layer, wherein the select gate electrode is directly over and laterally contacts opposing sidewalls of the second high κ dielectric layer, wherein bottom surfaces respectively of the select, control, and logic gate electrodes are uneven, wherein top surfaces respectively of the select, control, and logic gate electrodes are even, and wherein the select and control gate electrodes are respectively arranged directly over the select and control gate dielectric regions;

a dielectric layer arranged laterally between the select, control, and logic gate electrodes, and independent of the control and select gate dielectric regions, wherein the dielectric layer has a top surface that is even with the top surfaces respectively of the select, control, and logic gate electrodes; and a third high κ dielectric layer within which the logic gate electrode is arranged;

wherein the first high κ dielectric layer lines the control gate electrode and covers the charge trapping layer, wherein outer sidewalls of the first high κ dielectric layer are respectively even with outer sidewalls of the charge trapping layer, wherein the first high κ dielectric layer has a U-shaped profile directly under the control gate electrode and directly over the charge trapping layer, and wherein the U-shaped profile has inner sidewalls contacting the control gate electrode and outer sidewalls even with the outer sidewalls of the charge trapping layer.

18. The IC according to claim 17, wherein the semiconductor substrate further comprises individual source/drain regions of the control and select gate electrodes, wherein the individual source/drain regions are respectively on an opposite side of the control gate electrode as the common source/drain region and an opposite side of the select gate electrode as the common source/drain region, and wherein the control and select gate dielectric regions respectively have additional sidewalls that respectively adjoin the individual source/drain regions.

19. The IC according to claim 17, wherein the third high κ dielectric layer is directly under and laterally contacts the logic gate electrode, wherein the bottom surface of the first high κ dielectric layer is uneven with a bottom surface the third high κ dielectric layer, and wherein the bottom surface of the second high κ dielectric layer is uneven with the bottom surface of the third high κ dielectric layer.

* * * * *